United States Patent
Miyano

(10) Patent No.: US 8,269,398 B2
(45) Date of Patent: Sep. 18, 2012

(54) PIEZOELECTRIC ACTUATOR

(75) Inventor: Masaichi Miyano, Tokyo (JP)

(73) Assignee: TDK Corporation, Tokyo (JP)

( * ) Notice: Subject to any disclaimer, the term of this patent is extended or adjusted under 35 U.S.C. 154(b) by 27 days.

(21) Appl. No.: 12/976,356

(22) Filed: Dec. 22, 2010

(65) Prior Publication Data
US 2011/0175490 A1 Jul. 21, 2011

(30) Foreign Application Priority Data

Jan. 19, 2010 (JP) ................................ 2010-009079
Nov. 12, 2010 (JP) ................................ 2010-253678

(51) Int. Cl.
*H01L 41/08* (2006.01)
(52) U.S. Cl. .................................. 310/323.02
(58) Field of Classification Search .............. 310/323.02
See application file for complete search history.

(56) References Cited

U.S. PATENT DOCUMENTS

| | | | |
|---|---|---|---|
| 6,765,335 B2 * | 7/2004 | Wischnewskiy | 310/323.02 |
| 6,806,620 B1 * | 10/2004 | Wischnewskiy | 310/323.02 |
| 7,480,109 B1 * | 1/2009 | Hu et al. | 359/824 |
| 7,576,474 B2 | 8/2009 | Koc et al. | |
| 7,834,518 B2 * | 11/2010 | Wischnewskij et al. | 310/323.13 |
| 7,944,119 B2 * | 5/2011 | Nagaoka | 310/323.02 |
| 2009/0021113 A1 * | 1/2009 | Negishi et al. | 310/323.02 |
| 2010/0013353 A1 * | 1/2010 | Wischnewskij et al. | 310/317 |
| 2011/0050035 A1 * | 3/2011 | Wischnewskiy et al. | 310/317 |
| 2011/0175489 A1 * | 7/2011 | Wischnewskij et al. | 310/323.02 |

FOREIGN PATENT DOCUMENTS

| | | |
|---|---|---|
| JP | A-2005-65477 | 3/2005 |
| JP | A-2008-099549 | 4/2008 |
| KR | 10-2009-0015171 A | 2/2009 |

* cited by examiner

*Primary Examiner* — Mark Budd
(74) *Attorney, Agent, or Firm* — Oliff & Berridge, PLC

(57) ABSTRACT

A piezoelectric actuator has a piezoelectric element and a frictional portion. The piezoelectric element simultaneously generates first and second vibration modes in response to a voltage applied thereto. The frictional portion is arranged on an outer surface of the piezoelectric element and adapted to come into contact with a body to be driven and cause a frictional force therewith. The frictional portion has a glass-containing portion containing a glass material and being aimed such as to project from the outer surface of the piezoelectric element. Without restricting the size of the piezoelectric element, the piezoelectric actuator inhibits its driving state from fluctuating.

4 Claims, 10 Drawing Sheets

Fig.4
(a)
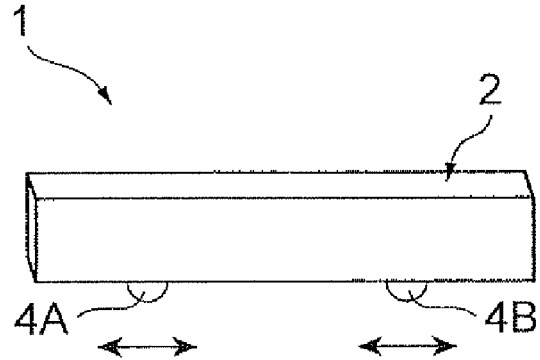
(b)
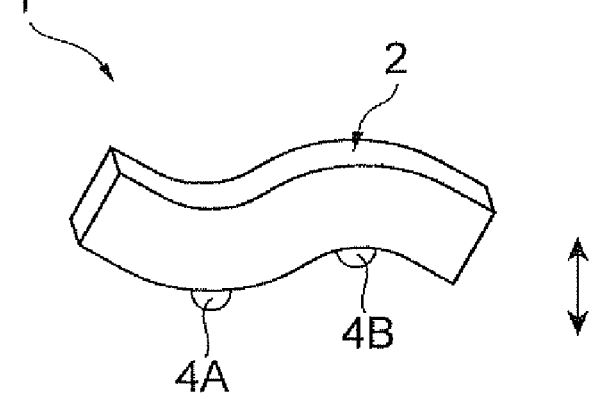

Fig.5
(a)
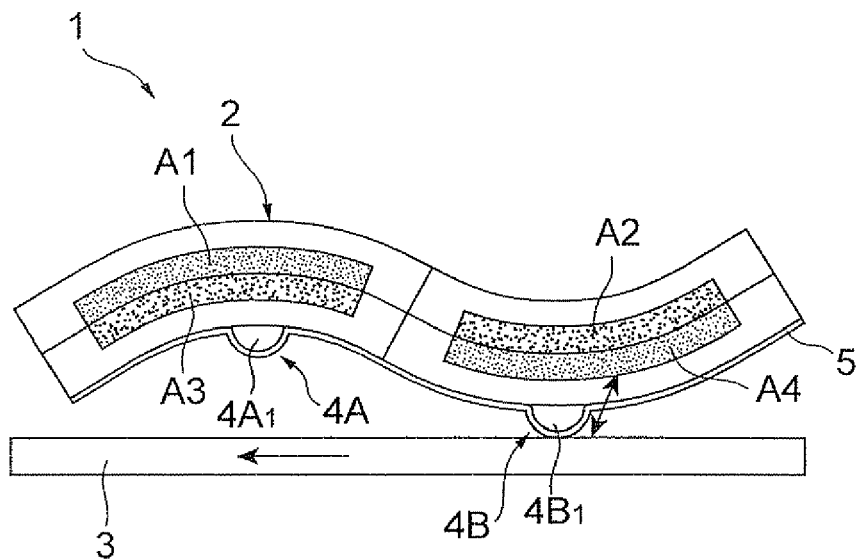
(b)
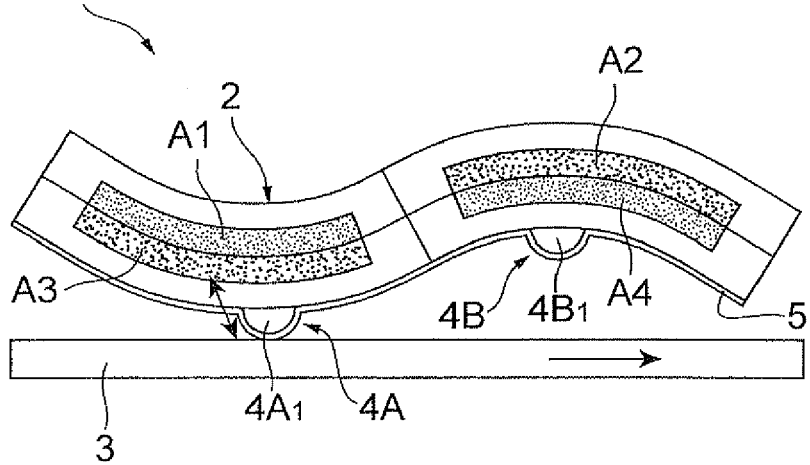

PIEZOELECTRIC ACTUATOR

BACKGROUND OF THE INVENTION

1. Field of the Invention

The present invention relates to a piezoelectric actuator.

2. Related Background Art

Known as a piezoelectric actuator is one comprising a piezoelectric body adapted to simultaneously generate first and two vibration modes in response to an electric power applied thereto and a frictional member which is separate from the piezoelectric body and partly secured to a concave portion formed as a depression on one side of the piezoelectric body (see, for example, Japanese Patent Application Laid-Open No. 2008-99549).

SUMMARY OF THE INVENTION

The piezoelectric actuator described in Japanese Patent Application Laid-Open No. 2008-99549 has problems as follows.

The piezoelectric element (piezoelectric body) has active and inactive portions which are adapted to be displaced and not, respectively, when a voltage is applied thereto. Since it is necessary for the concave portion to be formed in the inactive portion so as not to affect the active portion, the inactive portion is restricted in its designed sizes such as the width (thickness) thereof. That is, the width (thickness) of the inactive portion must be set greater than the depth of the concave portion, which inhibits the piezoelectric element from becoming smaller in size.

The frictional member is typically secured to the concave portion by making the inner form of the concave portion greater than the outer form of the frictional member and then fixing the frictional member to the inner surface of the concave portion with an adhesive or the like. Since the inner form of the concave portion is greater than the outer form of the frictional member, the position at which the frictional member is fixed to the concave portion may vary.

The piezoelectric element (piezoelectric body) has two resonance modes, i.e., first and second vibration modes. When the positions of frictional members vary among piezoelectric actuators, the resonance frequencies in their resonance modes fluctuate. This affects the magnitude of vibrations (amplitude) of piezoelectric elements, whereby the driving state varies among the piezoelectric actuators. The inventors conducted researches and studies and, as a result, have found that, when a bending vibration mode in a thickness direction of the piezoelectric element (piezoelectric body) is included as a resonance mode, the position of the frictional member extremely affects the resonance frequency in the bending vibration mode.

It is an object of the present invention to provide a piezoelectric actuator which, without restricting the size of its piezoelectric element, can inhibit its driving state from fluctuating.

The piezoelectric actuator in accordance with the present invention comprises a piezoelectric element adapted to simultaneously generate first and second vibration modes in response to a voltage applied thereto, and a frictional portion arranged on an outer surface of the piezoelectric element and adapted to come into contact with a body to be driven and cause a frictional force therewith; wherein the frictional portion has a glass-containing portion containing a glass material and being formed such as to project from the outer surface of the piezoelectric element.

Since the glass-containing portion is formed on the outer surface of the piezoelectric element such as to project from the outer surface, the forming of the glass-containing portion will not affect the designed size of the inactive portion in the piezoelectric actuator in accordance with the present invention. This can prevent the frictional portion (glass-containing portion) from restricting the size of the piezoelectric element.

In the present invention, it is not necessary for the piezoelectric element to be formed with a concave portion as in the piezoelectric actuator described in Japanese Patent Application Laid-Open No. 2008-99549. This can eliminate the variation in the position of the frictional portion caused by the forming of the concave portion, thereby inhibiting the resonance frequency from fluctuating in resonance modes (first and second vibration modes). As a result, the driving state of the piezoelectric actuator can be kept from varying.

The frictional portion may further have a protective film which is made of a material harder than the glass-containing portion and covers an outer surface of the glass-containing portion. The protective film may contain DLC, TiN, SiC, or BP. This can protect the glass-containing portion against damages and the like and prevent the glass-containing portion from peeling, thereby appropriately transmitting the displacement of the piezoelectric element to the body to be driven.

The glass material contained in the glass-containing portion may be dispersed in the piezoelectric element. This can improve the connection strength between the piezoelectric element and the glass-containing portion, thereby preventing the frictional portion from peeling and so forth.

The present invention can provide a piezoelectric actuator which, without restricting the size of its piezoelectric element, can inhibit its driving state from fluctuating.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is a view showing vibration modes of the multilayer piezoelectric actuator in accordance with the embodiment;

FIG. 5 is a view showing how the multilayer piezoelectric actuator in accordance with the embodiment drives a rotor;

DESCRIPTION OF THE PREFERRED EMBODIMENTS

In the following, preferred embodiments of the present invention will be explained in detail with reference to the accompanying drawings. In the explanation, the same constituents or those having the same functions will be referred to with the same signs, while omitting their overlapping descriptions.

Figure 1:
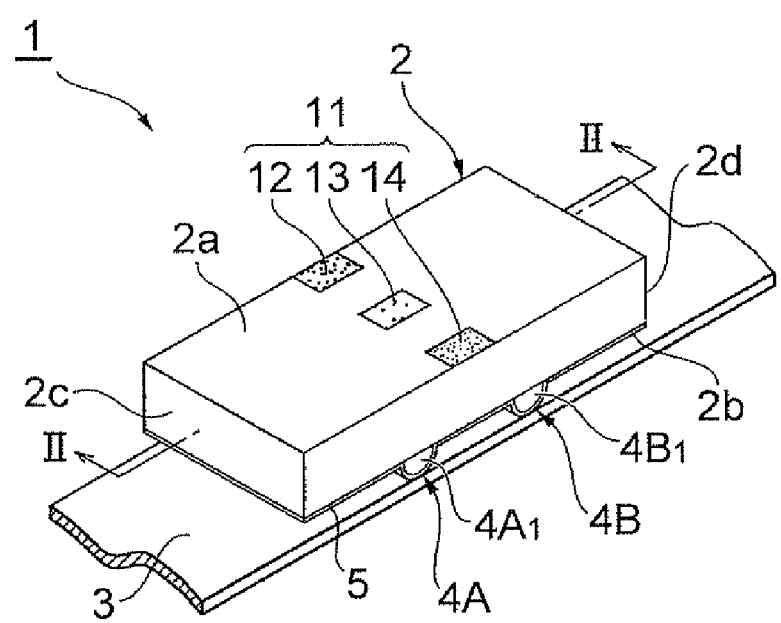
FIG. 1 is a perspective view of the multilayer piezoelectric actuator in accordance with an embodiment of the present invention.
Figure 2:
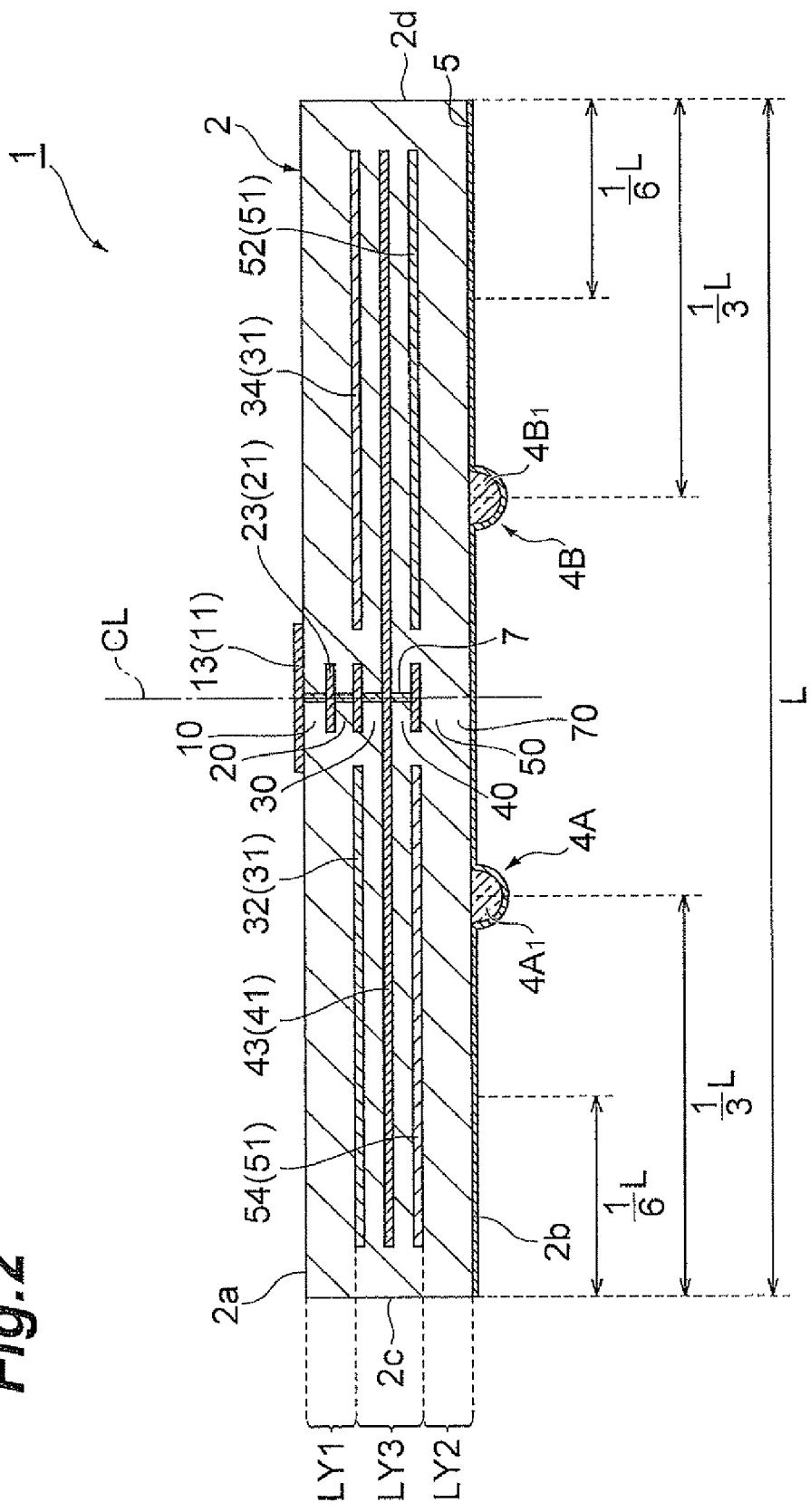
FIG. 2 is a sectional view taken along the line II-II of FIG. 1.
Figure 3:
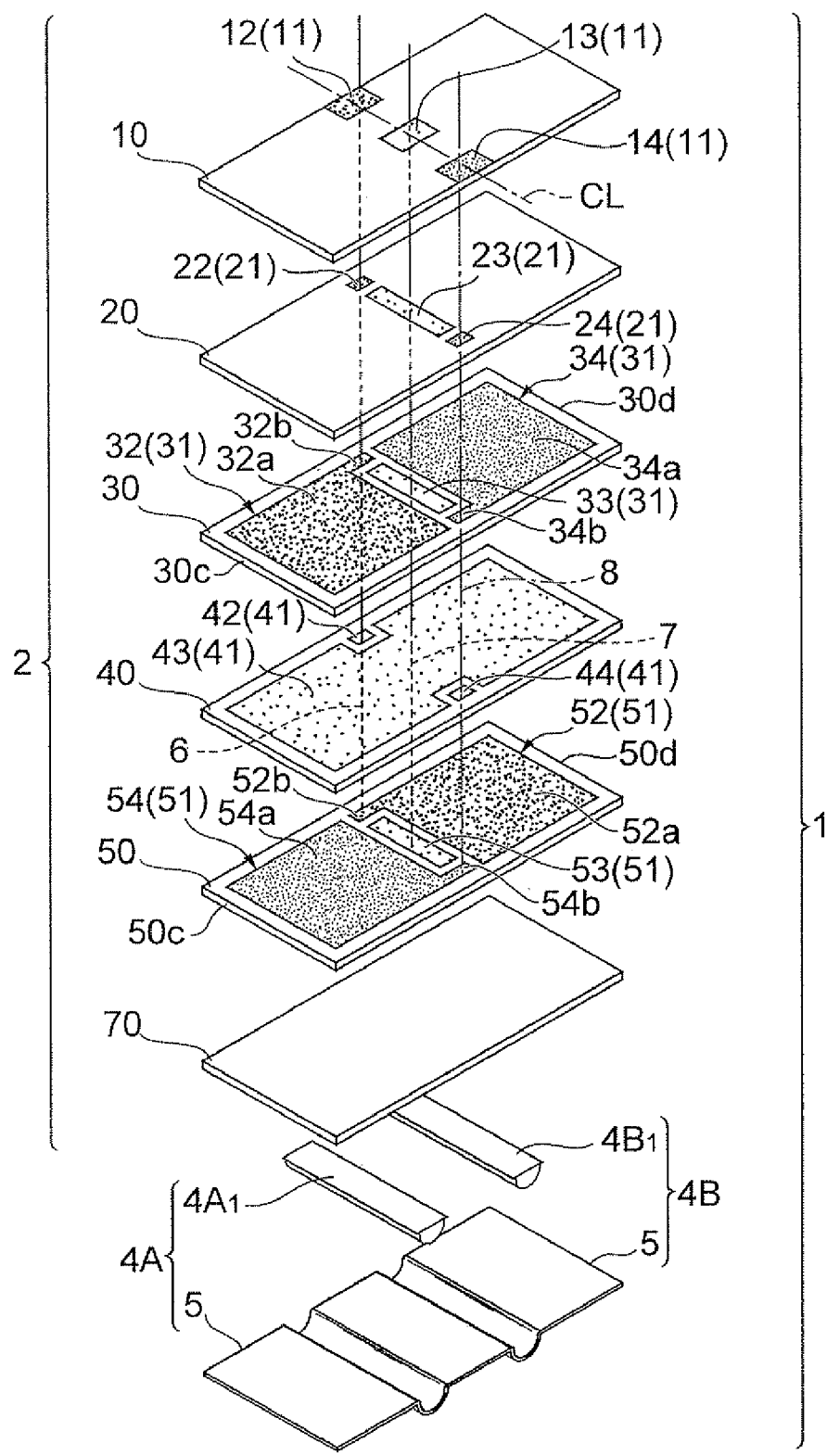
FIG. 3 is an exploded perspective view of the multilayer piezoelectric actuator 1 illustrated in FIG. 1.

With reference to FIGS. 1 to 3, the structure of the multilayer piezoelectric actuator in accordance with an embodiment of the present invention will be explained. FIG. 1 is a perspective view of the multilayer piezoelectric actuator in accordance with this embodiment. FIG. 2 is a sectional view taken along the line II-II of FIG. 1. FIG. 3 is an exploded perspective view of the multilayer piezoelectric actuator 1 shown in FIG. 1. FIGS. 2 and 3 depict a dash-single-dot line CL at the longitudinal center of the multilayer piezoelectric actuator. In FIG. 3, through-hole conductors are assumed to be formed at positions where vertically extending dotted lines pass, while through-holes are so small that they are not depicted.

As shown in FIG. 1, the multilayer piezoelectric actuator 1 functions to be displaced in response to an AC voltage applied thereto, so as to move a body to be driven 3 (e.g., rotor). The multilayer piezoelectric actuator 1 comprises a substantially rectangular parallelepiped piezoelectric element 2 formed by laminating and integrating a plurality of piezoelectric layers together and frictional portions 4A, 4B adapted to come into contact with the body to be driven 3 and cause a frictional force therewith. The frictional force lets the body to be driven 3 move.

The piezoelectric element 2 of the multilayer piezoelectric actuator 1 has an oblong first principal surface (upper face in FIG. 1) 2a and an oblong second principal surface (lower face in FIG. 1) 2b. In the following explanation, the longer- and shorter-side directions of the first and second principal surfaces 2a, 2b and the direction along which the first and second principal surfaces 2a, 2b oppose each other, i.e., the laminating direction of piezoelectric layers, will be referred to as longitudinal, width, and thickness directions of the piezoelectric element 2, respectively. The piezoelectric element 2 is set to have sizes on the order of 1 to 20 mm, 1 to 10 mm, and 0.2 to 5 mm in the longitudinal, width, and thickness directions, respectively.

An outer electrode layer 11 is disposed at the longitudinal center position of the first principal surface 2a of the piezoelectric element 2. The outer electrode layer 11 serves as terminal electrodes when mounting another external device thereon. The outer electrode layer 11 is arranged in the width direction at the longitudinal center position of the first principal surface 2a. The outer electrode layer 11 includes a first outer electrode 12, a ground outer electrode 13, and a second outer electrode 14 which are electrically insulated from each other on the first principal surface 2a.

The first outer electrode 12 is located on one end side of the width direction and has a rectangular form. The first outer electrode 12 is connected to a voltage output terminal of the external device. The ground outer electrode 13 is located at substantially the center in the width direction and has a rectangular form. The ground outer electrode 13 is connected to a ground terminal of the external device. The second outer electrode 14 is located on the other end side of the width direction and has a rectangular form. The second outer electrode 14 is connected to a voltage output terminal of the external device. The first outer electrode 12, ground outer electrode 13, and second outer electrode 14 are formed by applying an electrically conductive paste to the first principal surface 2a of the piezoelectric element 2 and sintering the paste at a predetermined temperature (e.g., about 700° C.). The sintered electrode layer obtained by sintering the electrically conductive paste may further be subjected to electroplating, so as to form a plating layer thereon. As the electrically conductive paste, one containing an electrically conductive material mainly composed of Ag may be used. An example of the plating layer is an Ni/Au plating layer.

The outer electrodes 12, 13, 14 may also be formed by sputtering, vapor deposition, or the like using a metal mask formed with respective openings at portions corresponding to the outer electrodes 12, 13, 14. Examples of the film structure constituting the outer electrodes 12, 13, 14 in this case include Cr/Ni, NiCu/Ag, SnAg, and Au.

The frictional portions 4A, 4B are disposed on the second principal surface 2b of the piezoelectric element 2 and cause a frictional force with the body to be driven 3. The frictional portions 4A, 4B have glass-containing portions $4A_1$, $4B_1$ and a protective film 5. The glass-containing portions $4A_1$, $4B_1$ contain a glass material. As the glass material to be contained, soda glass, crystal glass, borosilicate glass, and the like can be used. The glass-containing portions $4A_1$, $4B_1$ may further contain metal materials such as Ag and AgPd, ceramic materials such as $ZrO_2$ and $Al_2O_3$, metal oxide materials such as MgO and CaO, and the like in addition to the glass material mentioned above.

The glass-containing portions $4A_1$, $4B_1$ are arranged on the second principal surface 2b of the piezoelectric element 2 such as to project from the second principal surface 2b. Each of the glass-containing portions $4A_1$, $4B_1$ has a substantially semicircular cylindrical form such as to yield a substantially semicircular cross section when cut along a plane orthogonal to the longitudinal direction of the piezoelectric element 2. Letting L be the longitudinal size of the piezoelectric element 2, the glass-containing portion $4A_1$ is disposed such as to extend widthwise of the piezoelectric element 2 at a position separated by L/3 from one longitudinal end 2c of the piezoelectric element 2. The glass-containing portion $4B_1$ is disposed such as to extend widthwise of the piezoelectric element 2 at a position separated by L/3 from the other longitudinal end 2d of the piezoelectric element 2 (see FIG. 2). In this embodiment, the length of each of the glass-containing portions $4A_1$, $4B_1$ is the same as the width of the piezoelectric element 2.

The protective film 5 is made of a material harder than the glass-containing portions $4A_1$, $4B_1$, examples of which include DLC (Diamond-Like Carbon), TiN, SiC, and BP (Boron Phosphide). The protective film 5 covers the second principal surface 2b and the glass-containing portions $4A_1$, $4B_1$. The protective film 5 is not always required to cover the second principal surface 2b but may be formed such as to cover at least the glass-containing portions $4A_1$, $4B_1$. The thickness of the protective film 5 is on the order of 0.1 to 20 μm, for example.

As shown in FIGS. 2 and 3, the piezoelectric element 2 is constructed as a multilayer body in which rectangular sheet-like piezoelectric layers 10, 20, 30, 40, 50, 60, 70 having a piezoelectric characteristic (i.e., adapted to deform when energized), a relay electrode 21, a first inner electrode 31, a first ground electrode layer (ground electrode layer) 41, and a second inner electrode layer 51 are laminated. The relay electrode layer 21, first inner electrode layer 31, first ground electrode layer (ground electrode layer) 41, and second inner electrode layer 51 are arranged one by one along the laminating direction of the piezoelectric layers 10, 20, 30, 40, 50, 70 (i.e., thickness direction of the piezoelectric element 2) within the piezoelectric element 2.

The outer electrode layer 11 is formed on the piezoelectric layer 10 serving as the first principal surface 2a of the piezoelectric element 2 as will be explained later. The relay electrode layer 21, first inner electrode layer 31, first ground electrode layer 41, and second inner electrode layer 51 are formed on the piezoelectric layers 20, 30, 40, and 50, respectively.

Each of the piezoelectric layers 10, 20, 30, 40, 50, 70 is made of a piezoelectric ceramic material mainly composed of PZT, for example. Each of the piezoelectric layers 10, 20, 30, 40, 50, 70 has a thickness on the order of 10 to 100 μm, for example. In the multilayer piezoelectric actuator 1 in practice, the plurality of piezoelectric layers 10, 20, 30, 40, 50, 70 are integrated to such an extent that their boundaries are indiscernible.

The relay electrode layer 21 is arranged widthwise of the piezoelectric layer 20 at the longitudinal center position thereof. The relay electrode layer 21 includes a first relay electrode 22, a ground relay electrode 23, and a second relay electrode 24 which are electrically insulated from each other on the piezoelectric layer 20. The first relay electrode 22 is located on one end side of the width direction and has a rectangular form. The ground relay electrode 23 is located at the center of the width direction and has a rectangular form whose longitudinal direction is oriented in the width direction. The second relay electrode 24 is located on the other end side of the width direction and has a rectangular form.

The first inner electrode layer 31 includes a first electrode 32, a ground relay electrode 33, and a second electrode 34 which are electrically insulated from each other on the piezoelectric layer 30. The ground relay electrode 33 is positioned such as to overlap the ground relay electrode 23 at the longitudinal center position as seen from the thickness direction and has a rectangular form.

The first electrode 32 has an electrode portion 32a and a relay electrode portion 32b. The electrode portion 32a is disposed closer to one end 2c (i.e., closer to one end 30c of the piezoelectric layer 30) than is the longitudinal center position of the piezoelectric element 2. The relay electrode portion 32b is disposed at the longitudinal center. The electrode portion 32a is positioned such as to cover the upper face of the piezoelectric layer 30 in substantially all of the area extending from the ground relay electrode 33 to one end 30c and has a rectangular form. The relay electrode portion 32b is positioned such as to project from the electrode portion 32a to the longitudinal center position and overlap the first relay electrode 22 as seen from the thickness direction and has a rectangular form.

The second electrode 34 has an electrode portion 34a and a relay electrode portion 34b. The electrode portion 34a is disposed closer to the other end 2d (i.e., closer to the other end 30d of the piezoelectric layer 30) than is the longitudinal center position of the piezoelectric element 2. The relay electrode portion 34b is disposed at the longitudinal center. The electrode portion 34a is positioned such as to cover the upper face of the piezoelectric layer 30 in substantially all of the area extending from the ground relay electrode 33 to the other end 30d and has a rectangular form. The relay electrode portion 34b is positioned such as to project from the electrode portion 34a to the longitudinal center position and overlap the second relay electrode 24 as seen from the thickness direction and has a rectangular form.

The first ground electrode layer 41 includes a first relay electrode 42, a ground electrode 43, and a second relay electrode 44 which are electrically insulated from each other on the piezoelectric layer 40. The ground electrode 43 is positioned such as to cover substantially the whole surface of the upper face of the piezoelectric layer 40 and has a substantially rectangular form. The ground electrode 43 is disposed such as to overlap all of the electrode portions 32a, 34a and ground relay electrodes 23, 33 as seen from the thickness direction. At the longitudinal center position of the ground electrode 43, rectangular recesses are formed on both end sides of the width direction of the piezoelectric layer 40. The first and second relay electrodes 42, 44 are disposed at the recesses, respectively. The first relay electrode 42 is positioned such as to overlap the relay electrode portion 32b and the first relay electrode 22 as seen from the thickness direction. The second relay electrode 44 is positioned such as to overlap the relay electrode portion 34b and the second relay electrode 24 as seen from the thickness direction.

The second inner electrode layer 51 includes a third electrode 54, a ground relay electrode 53, and a fourth electrode 52 which are electrically insulated from each other on the piezoelectric layer 50. The ground relay electrode 53 is positioned such as to overlap the ground relay electrodes 23, 33 at the longitudinal center position as seen from the thickness direction and has a rectangular form.

The third electrode 54 has an electrode portion 54a and a relay electrode portion 54b. The electrode portion 54a is disposed closer to one end 2c (i.e., closer to one end 50c of the piezoelectric layer 50) than is the longitudinal center position of the piezoelectric element 2. The relay electrode portion 54b is disposed at the longitudinal center. The electrode portion 54a is positioned such as to cover the upper face of the piezoelectric layer 50 in substantially all of the area extending from the ground relay electrode 53 to one end 50c and has a rectangular form. As a consequence, the electrode portion 54a overlaps the electrode portion 32a and a portion of the ground electrode 43 as seen from the thickness direction. The relay electrode portion 54b has a rectangular form such as to project from the electrode portion 54a to the longitudinal center position and overlap the second relay electrodes 24, 44 and the relay electrode portion 34b as seen from the thickness direction.

The fourth electrode 52 includes an electrode portion 52a and a relay electrode portion 52b. The electrode portion 52a is disposed closer to the other end 2d (i.e., closer to the other end 50d of the piezoelectric layer 50) than is the longitudinal center position of the piezoelectric element 2. The relay electrode portion 52b is disposed at the longitudinal center. The electrode portion 52a is positioned such as to cover the upper face of the piezoelectric layer 50 in substantially all of the area extending from the ground relay electrode 53 to the other end 50d and has a rectangular form. As a consequence, the electrode portion 52a overlaps the electrode portion 34a and a portion of the ground electrode 43 as seen from the thickness direction. The relay electrode portion 52b is positioned such as to project from the electrode portion 52a to the longitudinal center position and overlap the first relay electrodes 22, 42 and relay electrode portion 32b thereabove as seen from the thickness direction and has a rectangular form.

Through-holes penetrating through the piezoelectric layers 10, 20, 30, 40 in their thickness direction are formed at their positions corresponding to the first relay electrodes 22, 42 and relay electrode portions 32b, 52b. A first through-hole conductor 6 is disposed in these through-holes. The first through-hole conductor 6 electrically connects the first outer electrode 12, first relay electrode 22, first electrode 32, first relay electrode 42, and fourth electrode 52 together.

Through-holes penetrating through the piezoelectric layers 10, 20, 30, 40 in their thickness direction are formed at their positions corresponding to the ground relay electrodes 23, 33, 53 and the longitudinal center region of the ground electrode 43. A ground through-hole conductor 7 is disposed in these through-holes. The ground through-hole conductor 7 electrically connects the ground outer electrode 13, ground relay electrodes 23, 33, ground electrode 43, and ground relay electrode 53 together.

Through-holes penetrating through the piezoelectric layers 10, 20, 30, 40 in their thickness direction are formed at their positions corresponding to the second relay electrodes 24, 44 and relay electrode portions 34b, 54b. A second through-hole conductor 8 is disposed in these through-holes. The second through-hole conductor 8 electrically connects the second outer electrode 14, second relay electrode 24, second electrode 34, second relay electrode 44, and third electrode 54 together.

The first through-hole conductor 6, ground through-hole conductor 7, and second through-hole conductor 8 are located at the longitudinal center position of the piezoelectric element 2 and are arranged in a row along the width direction of the piezoelectric element 2. The through-hole conductors 6, 7, 8 contain an electrically conductive material. The electrically conductive material contained in the through-hole conductors 6, 7, 8 may be at least one kind of metals selected from the group consisting of Pd, Ag, Cu, W, Mo, Sn, and Ni or an alloy containing at least one kind of these metals. Each of the through-hole conductors 6, 7, 8 has a diameter on the order of 20 to 100 μm, for example. The piezoelectric element 2 constituted by the electrode layers 11, 21, 31, 41, 51 and piezoelectric layers 10, 20, 30, 40, 50, 70 includes thickness adjustment layers LY1, LY2 and a driving layer LY3 for vibrating the piezoelectric element 2. The driving layer LY3 includes an active portion, while each of the thickness adjustment layers LY1, LY2 includes an inactive portion.

The driving layer LY3 is constituted by the first inner electrode layer 31, piezoelectric layer 30, first ground electrode layer 41, piezoelectric layer 40, and second inner electrode layer 51. The thickness adjustment layer LY1 is constituted by the piezoelectric layer 10, relay electrode layer 21, and piezoelectric layer 20. The thickness adjustment layer LY2 is constituted by the piezoelectric layers 50, 70. At the time of manufacturing the piezoelectric element 2, the thickness adjustment layers LY1, LY2 are polished so as to adjust their thickness, thereby regulating the vibration frequency in the piezoelectric element 2. The thickness adjustment layers LY1, LY2 are set to substantially the same thickness, whereby the piezoelectric element 2 has a structure symmetrical about the thickness direction.

In the driving layer LY3, the piezoelectric layer 30 held between the first inner electrode layer 31 and the first ground electrode layer 41 and the piezoelectric layer 40 held between the first ground electrode layer 41 and the second inner electrode layer 51 have been depolarized. The depolarization is effected from the first inner electrode layer 31 to the first ground electrode layer 41 and from the second inner electrode layer 51 to the first ground electrode layer 41.

Operations of the multilayer piezoelectric actuator 1 will now be explained with reference to FIGS. 4 and 5. FIG. 4 is a view showing vibration modes of the multilayer piezoelectric actuator 1. FIG. 5 is a view showing how the multilayer piezoelectric actuator 1 drives the body to be driven 3.

The multilayer piezoelectric actuator 1 has two resonance modes at the time of driving. Specifically, the multilayer piezoelectric actuator 1 vibrates according to a longitudinal vibration mode of vibrating longitudinally of the piezoelectric element 2 as shown in FIG. 4(a) and a bending vibration mode in the thickness direction of the piezoelectric element 2 as shown in FIG. 4(b) which are superposed on each other. The respective resonance frequencies in the longitudinal and bending vibration modes have been fitted to each other by polishing the thickness adjustment layers LY1, LY2 of the piezoelectric element 2 (see FIG. 2).

FIG. 5 shows a state in which the longitudinal and bending vibration modes are superposed on each other. When an active portion A1 constructed by the first electrode 32, ground electrode 43, and dielectric layer 30 and an active portion A4 constructed by the fourth electrode 52, ground electrode 43, and piezoelectric layer 40 are driven, as illustrated in FIG. 5(a), the frictional portion 4B comes into contact with the body to be driven 3, thereby causing a frictional force between the frictional portion 4B and the body to be driven 3. The frictional force generated between the frictional portion 4B and the body to be driven 3 lets the body to be driven 3 move in the arrowed direction in FIG. 5(a).

When an active portion A2 constructed by the second electrode 34, ground electrode 43, and piezoelectric layer 30 and an active portion A3 constructed by the third electrode 54, ground electrode 43, and piezoelectric layer 40 are driven, as shown in FIG. 5(b), the frictional portion 4A comes into contact with the body to be driven 3, thereby causing a frictional force between the frictional portion 4A and the body to be driven 3. The frictional force generated between the frictional portion 4A and the body to be driven 3 lets the body to be driven 3 move in the arrowed direction in FIG. 5(b).

When the piezoelectric element 2 is driven by applying voltages whose phases shift from each other by 90° to the first and second outer electrodes 12, 14, respectively, elliptic motions whose phases shift from each other by 180° occur in the frictional portions 4A, 4B, respectively. As a consequence, the frictional forces alternately act on the body to be driven 3, whereby the body to be driven 3 moves.

Referring to FIGS. 2 and 5, the above-mentioned vibrations have nodes (where no amplitudes occur in the vibrations) at the longitudinal center position of the piezoelectric element 2, a position separated from one end 2c by L/6, and a position separated from the other end 2d by L/6, respectively. One end 2c, the other end 2d, a position separated from one end 2c by L/3 (i.e., the position where the frictional portion 4A is disposed), and a position separated from the other end 2d by L/3 (i.e., the position where the frictional portion 4B is disposed) are positions where the maximum amplitude occurs.

Figure 6:
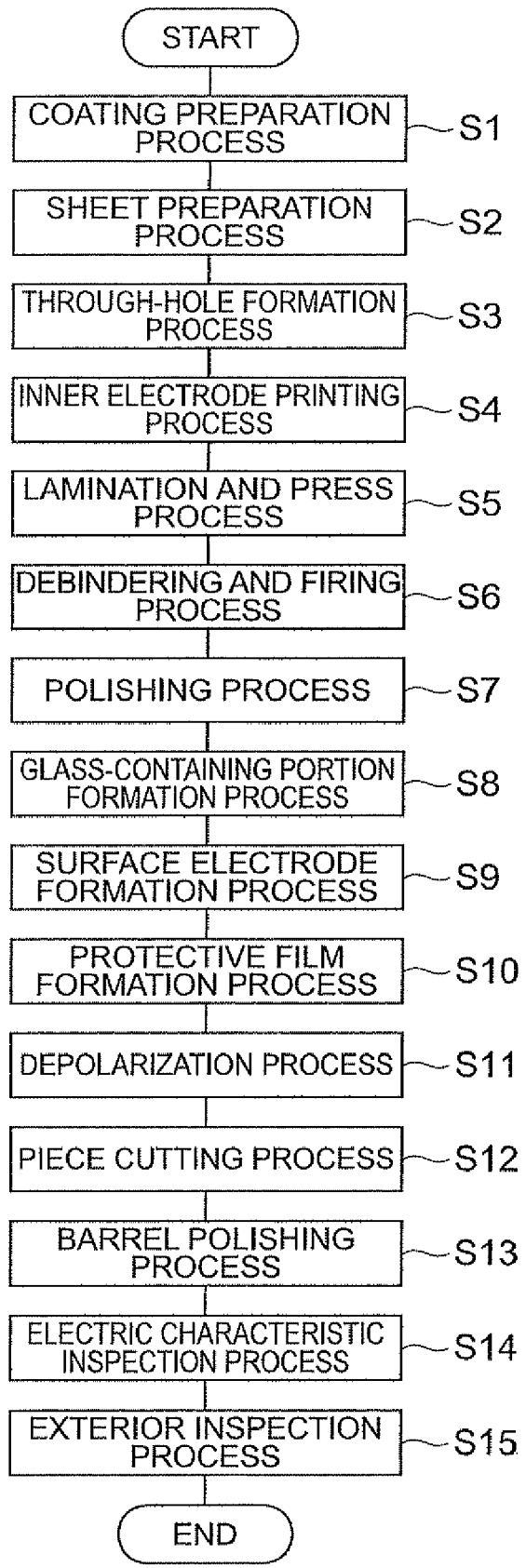
FIG. 6 is a flowchart showing a method of manufacturing the multilayer piezoelectric actuator in accordance with the embodiment.

A method of manufacturing the multilayer piezoelectric actuator 1 in accordance with this embodiment will now be explained with reference to FIG. 6. FIG. 6 is a flowchart showing the method of manufacturing the multilayer piezoelectric actuator 1 in accordance with this embodiment.

As shown in FIG. 6, the process for manufacturing the multilayer piezoelectric actuator 1 begins with a coating preparation process S1. The coating preparation process S1 mixes a piezoelectric material for making the piezoelectric layers 70, an organic solvent, and an organic binder together, so as to turn them into a coating material. Subsequently, a sheet preparation process S2 is carried out. The sheet preparation process S2 applies the coating material obtained by the coating preparation process S1 to PET films, so as to form piezoelectric sheets each having a thickness corresponding to that of each piezoelectric layer.

After the sheet preparation process S2, a through-hole formation process S3 is carried out. The through-hole formation process S3 forms the piezoelectric sheets with through-holes at predetermined positions corresponding to positions where the through-hole conductors 6, 7, 8 are arranged. After forming the piezoelectric sheets with the through-holes, an inner electrode printing process S4 is carried out.

Using an electrically conductive paste, the inner electrode printing process S4 forms the upper faces of uncut piezoelectric layers 10 to 70 with their corresponding electrode patterns and through-hole conductor patterns by screen printing or the like. Here, the piezoelectric layers 10 to 70 are formed with patterns corresponding to the outer electrode layer 11, relay electrode layer 21, first inner electrode layer 31, first ground electrode layer 41, second inner electrode layer 51, and through-hole conductors 6, 7, 8. After forming the electrode patterns, the lamination and press process S5 is carried out.

Figure 7:
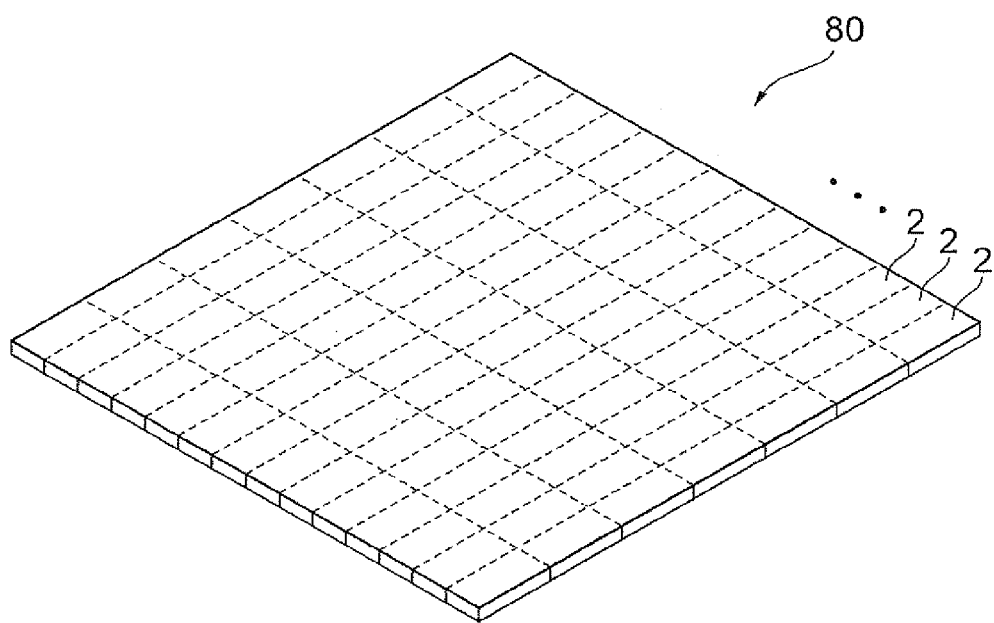
FIG. 7 is a perspective view showing a multilayer body obtained by a lamination and press process.

The lamination and press process S5 laminates the uncut piezoelectric layers 10, 20, 30, 40, 50, 70 in this order from the upper side and presses them. This yields a multilayer body 80 as shown in FIG. 7. After the pressing, a debindering and firing process S6 is carried out. Here, under a predetermined heat treatment condition, the multilayer body 80 is debindered and fired.

After firing the multilayer body 80, a polishing process S7 is carried out. The polishing process S7 polishes the thickness adjustment layers LY1, LY2, so as to fit the respective resonance frequencies of the longitudinal and bending vibration modes to each other. Specifically, the piezoelectric layer 10 or 70 is polished. After polishing, a glass-containing portion formation process S8 is carried out.

Figure 8:
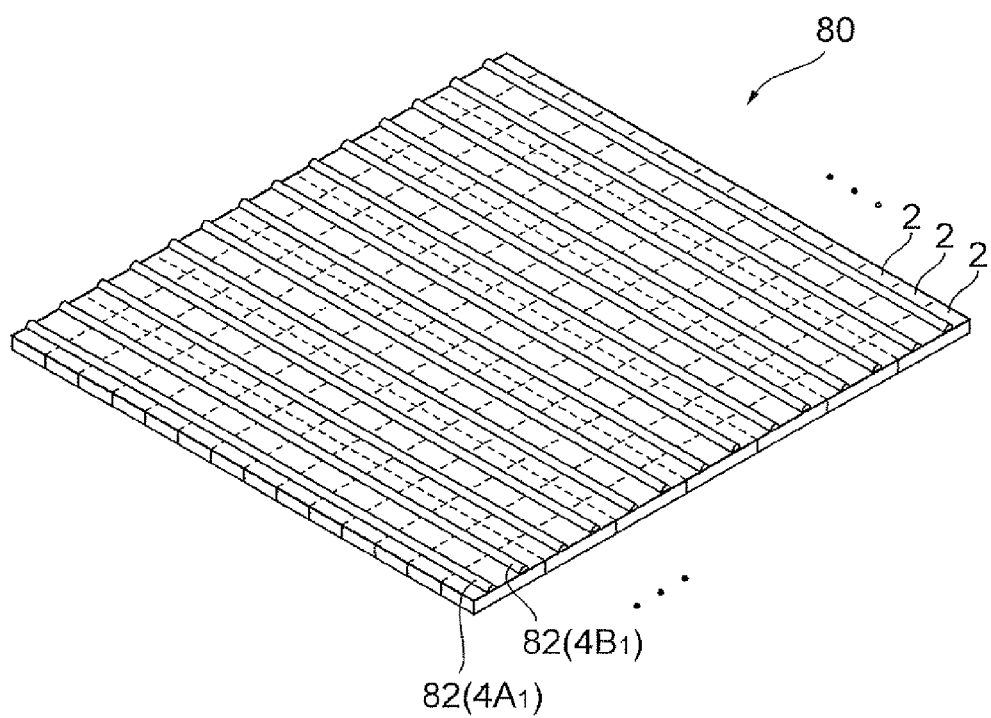
FIG. 8 is a perspective view showing a multilayer body and glass patterns (glass-containing portions) obtained by a glass-containing portion formation process.

The glass-containing portion formation process S8 prepares a glass paste containing the above-mentioned glass material. Then, the glass paste is applied to desirable positions on the outer surface constituted by the piezoelectric layer 70 in the multilayer body 80 as shown in FIG. 8. This forms glass patterns 82 on the outer surface of the multilayer body 80. The glass patterns 82 are formed on the outer surface of the multilayer body 80 such as to extend in directions corresponding to the width directions of the piezoelectric elements 2. Each glass pattern 82 has a height on the order of 10 to 200 μm, for example. Each glass pattern 82 has a width on the order of 50 to 700 μm, for example.

The glass paste is obtained by mixing a powder of the above-mentioned glass material, an organic binder, and an organic solvent. The glass paste may also contain any of powders of the above-mentioned metal, ceramic, and metal oxide materials. The glass paste may be applied by a dispenser, screen printing, or the like. Thereafter, under a predetermined heat treatment condition, the glass paste is fired together with the multilayer body 80. This forms the glass-containing portions $4A_1$, $4B_1$ on the multilayer body 80. At this time, the glass material contained in the glass paste partly diffuses into the multilayer body 80 (piezoelectric elements 2), thereby improving the connection strength between the multilayer body 80 (piezoelectric elements 2) and the glass-containing portions $4A_1$, $4B_1$. Each of the glass-containing portions $4A_1$, $4B_1$ has a height on the order of 10 to 200 μm, for example, and a width on the order of 50 to 700 μm, for example.

The glass paste is applied by the dispenser or screen printing with a positional precision much higher than a machining precision with which the multilayer body 80 is formed with a concave portion. This improves the positional precision for forming the glass-containing portions $4A_1$, $4B_1$ and thus can prevent the glass-containing portions $4A_1$, $4B_1$ from shifting their positions. When the glass paste is applied by the dispenser or screen printing, the height of the glass patterns 82 can be kept low as mentioned above, whereby the multilayer piezoelectric actuator 1 can attain a lower profile. The application by the dispenser or screen printing is a known process, which can easily form the glass-containing portions $4A_1$, $4B_1$ at a very low cost.

Subsequently, a surface electrode formation process S9 is carried out. Here, using the electrically conductive paste, electrode patterns corresponding to the first outer electrode 12, ground outer electrode 13, and second outer electrode 14 for electrically connecting the through-hole conductors 6, 7, 8 exposed at the upper face of the piezoelectric layer 10 to external circuits are formed on the upper face of the piezoelectric layer 10 by screen printing or the like. Thereafter, the electrode patterns are sintered under a predetermined heat treatment condition. This forms the first outer electrode 12, ground outer electrode 13, and second outer electrode 14. The outer electrodes 12, 13, 14 may be formed by sputtering, vapor deposition, or the like through a metal mask as mentioned above.

Next, a protective film formation process S10 is carried out. The protective film formation process S10 forms the protective film 5 so as to cover the outer surface of the multilayer body 80 formed with the glass-containing portions $4A_1$, $4B_1$ and the glass-containing portions $4A_1$, $4B_1$. For forming the protective film 5, plasma CVD or the like can be used.

Next, a depolarization process S11 is carried out. The depolarization process S11 performs depolarization by a known technique in order for piezoelectric materials to attain fixed polarities. Thereafter, a piece cutting process S12 for cutting the multilayer body 80 into piezoelectric elements 2 is carried out. The multilayer body 80 is cut along dotted lines shown in FIGS. 7 and 8. The individually cut piezoelectric elements 2 are put into a barrel polishing machine, so as to perform a barrel polishing process S13. Finally, an electric characteristic inspection process S14 for inspecting electric characteristics and an exterior inspection process S15 are carried out, whereby the manufacturing process shown in FIG. 6 ends.

Operations and effects of thus constructed multilayer piezoelectric actuator 1 will now be explained.

As mentioned above, the multilayer piezoelectric actuator 1 comprises a rectangular parallelepiped element body, formed by laminating a plurality of piezoelectric layers, having first and second principal surfaces; a first inner electrode layer, arranged within the element body so as to oppose the first and second principal surfaces, having a first electrode including an electrode portion arranged closer to one end than is a center position in a longitudinal direction of the element body and a second electrode, electrically insulated from the first electrode, including an electrode portion arranged closer to the other end than is the center position; a ground electrode layer having a ground electrode arranged within the element body so as to oppose the electrode portions of the first and second electrodes of the first inner electrode layer through the piezoelectric layer on the second principal surface side; a second inner electrode layer, arranged within the element body so as to oppose the ground electrode layer through the piezoelectric layer, having a third electrode including an electrode portion arranged closer to one end than is the center position and a fourth electrode, electrically insulated from the third electrode, including an electrode portion arranged closer to the other end than is the center position; an outer electrode layer, formed on the first principal surface, having a first outer electrode, a second outer electrode, and a ground outer electrode which are electrically insulated from each other; a first through-hole conductor extending in a thickness direction which is a laminating direction of the piezoelectric layers within the element body so as to electrically connect the first outer electrode, first electrode, and fourth electrode to each other; a second through-hole conductor extending in the thickness direction within the element body so as to electrically connect the second outer electrode, second electrode, and third electrode to each other; and a ground through-hole conductor extending in the thickness direction within the element body so as to electrically connect the ground outer electrode and ground electrode to each other; the first through-hole conductor, second through-hole conductor, and ground through-hole conductor are placed at the center position and arranged in a row along the width direction of the element body; and the piezoelectric actuator 1 generates a longitudinal vibration in its longitudinal direction and a bending vibration in its thickness direction.

In the multilayer piezoelectric actuator 1 in accordance with this embodiment, the first through-hole conductor 6 for electrically connecting the first outer electrode 12, first electrode 32, and fourth electrode 52 to each other within the piezoelectric element 2, the second through-hole conductor 8 for electrically connecting the second outer electrode 14, second electrode 34, and third electrode 54 to each other within the piezoelectric element 2, and the ground through-hole conductor 7 for electrically connecting the ground outer electrode 13 and ground electrode 43 to each other within the piezoelectric element 2 are placed at the longitudinal center position of the piezoelectric element 2 and arranged in a row in the width direction of the piezoelectric element 2. Electric connections among electrodes are achieved by the through-hole conductors 6, 7, 8 formed within the piezoelectric element 2. Therefore, the piezoelectric actuator 1 can be designed without taking account of contact with other components, and its components can be made smaller than in the case where side electrodes are provided as in conventional multilayer piezoelectric actuators.

The through-hole conductors 6, 7, 8 for connecting the electrodes to each other are disposed within the piezoelectric element 2 and thus can be prevented from being affected by their surrounding environments. This can improve the reliability.

When there is a side electrode, a process of forming the side electrode for each piezoelectric element is necessary after forming the multilayer body 80 and cutting it into piezoelectric elements during the manufacture. Providing the through-hole conductors 6, 7, 8 within the piezoelectric element 2 can eliminate the side electrode formation process after cutting the multilayer body 80.

Through the ground electrode 43, the first and fourth electrodes 32, 52 diagonally positioned with respect to the longitudinal center position of the piezoelectric element 2 are electrically connected to each other, while the second and third electrodes 34, 54 positioned similarly are electrically connected to each other. Therefore, the multilayer piezoelectric actuator 1 causes a longitudinal vibration in the longitudinal direction and a bending vibration in the thickness direction with their node located at the center position of the piezoelectric element 2 (where the center line CL is located). Since the through-hole conductors 6, 7, 8 are formed at the center position serving as a node, the multilayer piezoelectric actuator 1 can alleviate stresses acting on the through-hole conductors 6, 7, 8. This can improve the reliability.

Figure 9:
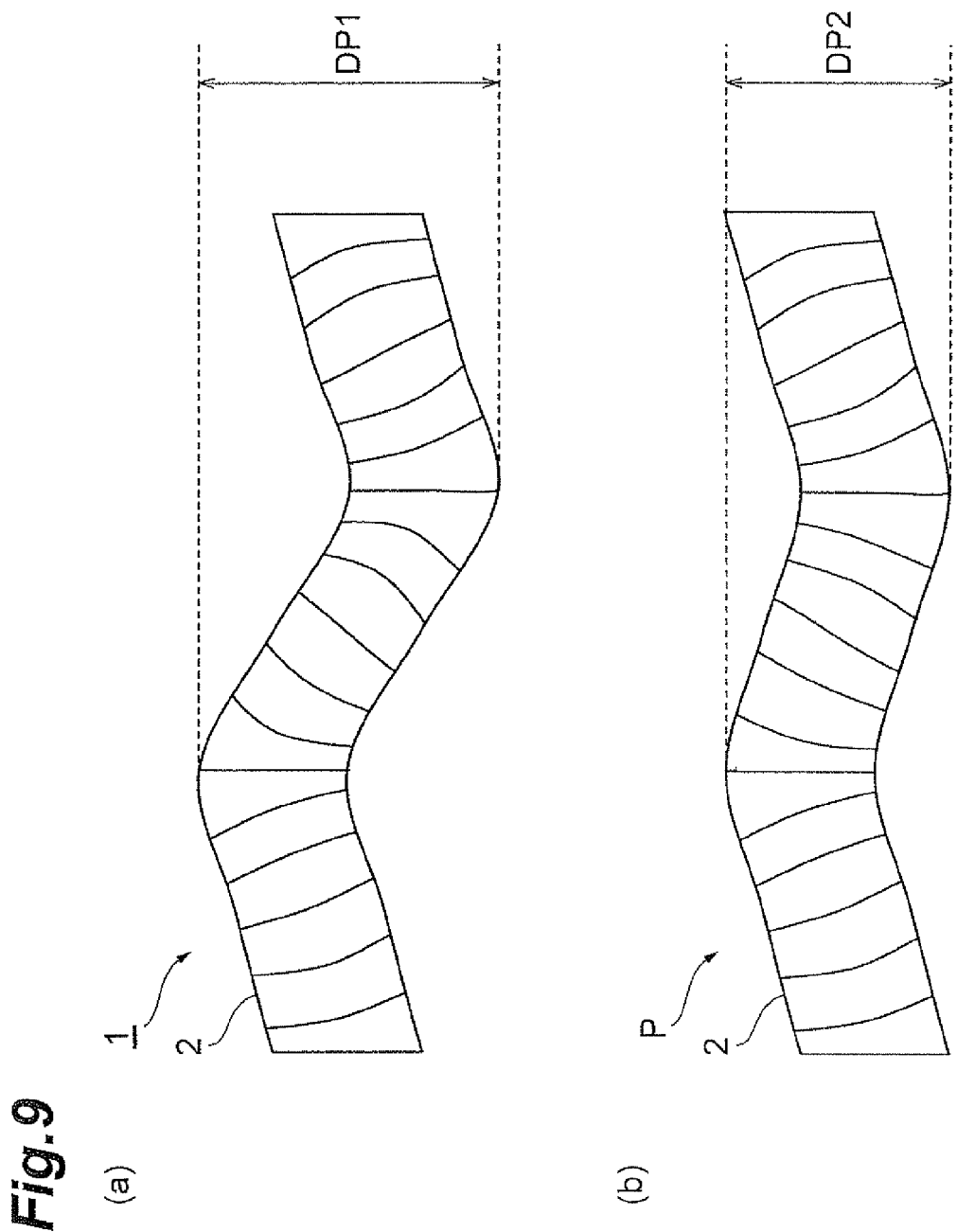
FIG. 9 is a view showing respective magnitudes of displacement in the piezoelectric actuator in accordance with the embodiment and a conventional multilayer piezoelectric actuator at the time of driving.

Surroundings of a piezoelectric element portion where a through-hole conductor is disposed become softer in structure. Therefore, providing a plurality of through-hole conductors 6, 7, 8 at the longitudinal center position of the piezoelectric element 2 makes the structure of the piezoelectric element 2 softer in the vicinity of its center position, whereby the piezoelectric element 2 becomes easier to deform. Specifically, as shown in FIG. 9, the displacement (indicated by displacement DP1 in FIG. 9) of the multilayer piezoelectric actuator 1 in accordance with this embodiment is greater than the displacement (indicated by displacement DP2 in FIG. 9) of a conventional multilayer piezoelectric actuator P in which no through-hole conductors are formed at the longitudinal center position. This can increase the displacement at the time of driving without enhancing internal stresses acting on the piezoelectric element 2, thereby improving performances.

The foregoing can improve the reliability and performances of the multilayer piezoelectric actuator 1 while making it smaller.

In the multilayer piezoelectric actuator 1, the glass-containing portions $4A_1$, $4B_1$ (frictional portions 4A, 4B) are formed on the outer surface of the piezoelectric element 2 such as to project from the outer surface. Therefore, the forming of the glass-containing portions $4A_1$, $4B_1$ (frictional portions 4A, 4B) will not affect the designed size of the thickness adjustment layers LY1, LY2 that are inactive portions. The piezoelectric element 2 can be prevented from being restricted in size by the glass-containing portions $4A_1$, $4B_1$ (frictional portions 4A, 4B).

It is not necessary for the piezoelectric element to be formed with a concave portion in the multilayer piezoelectric actuator 1 as in the conventional multilayer piezoelectric actuator. This can eliminate the variation in the position of the frictional portion caused by the forming of the concave portion, thereby inhibiting the resonance frequency from fluctuating in resonance modes (the longitudinal vibration mode and bending vibration mode). As a result, the driving state of the multilayer piezoelectric actuator 1 can be kept from varying.

The frictional portions 4A, 4B have the protective film 5, made of a material harder than the glass-containing portions $4A_1$, $4B_1$, covering the glass-containing portions $4A_1$, $4B_1$. The protective film 5 contains DLC, TiN, SIC, or BP. This can protect the glass-containing portions $4A_1$, $4B_1$ against damages and the like and prevent the glass-containing portions $4A_1$, $4B_1$ from peeling, thereby appropriately transmitting the displacement of the piezoelectric element 2 to the body to be driven 3.

In the multilayer piezoelectric actuator 1, the glass material contained in the glass-containing portions $4A_1$, $4B_1$ is dispersed in the piezoelectric element 2. This can improve the connection strength between the piezoelectric element 2 and the glass-containing portions $4A_1$, $4B_1$, thereby preventing the glass-containing portions $4A_1$, $4B_1$ (frictional portions 4A, 4B) from peeling and so forth.

Though a preferred embodiment of the present invention is explained in the foregoing, the present invention is not necessarily restricted to the above-mentioned embodiment and can be modified in various manners within a scope not deviating from the gist thereof.

Figure 10:
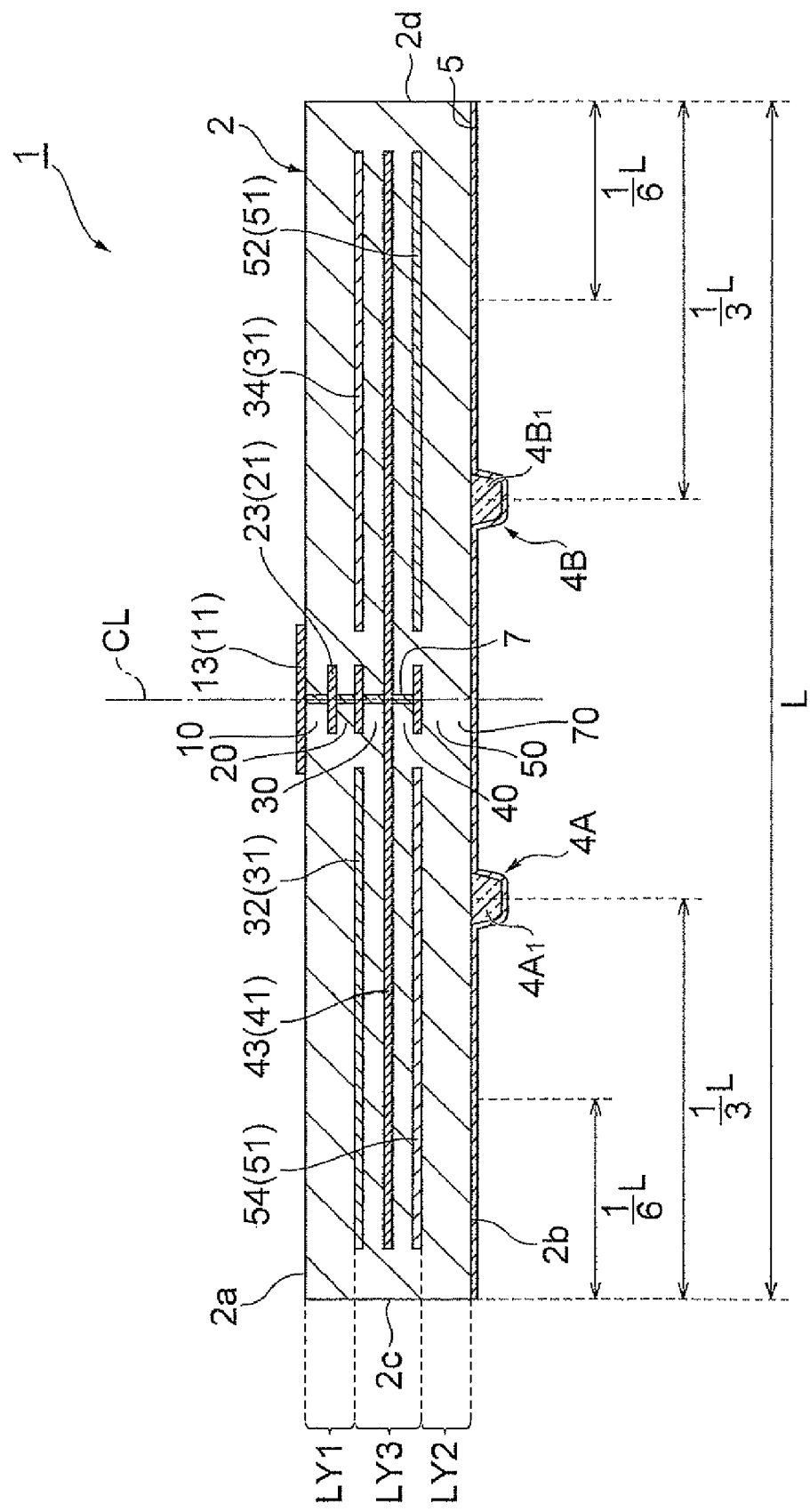
FIG. 10 is a sectional view showing the multilayer piezoelectric actuator in accordance with a modified example of the embodiment.

For example, the form and size of the frictional portions 4A, 4B (glass-containing portions $4A_1$, $4B_1$) are not limited to those illustrated in the above-mentioned embodiment. For example, each of the glass-containing portions $4A_1$, $4B_1$ may have a substantially trapezoidal cross section when cut along a plane orthogonal to the longitudinal direction of the piezoelectric element 2, i.e., a flat top, as shown in FIG. 10.

When the glass-containing portion formation process S8 provides the glass paste, the top height of thus provided glass paste fluctuates, which is reflected in variations in the height of the glass-containing portions $4A_1$, $4B_1$. When the height of the glass-containing portions $4A_1$, $4B_1$ varies, the portion of the protective film 5 corresponding to the highest position of the glass-containing portions $4A_1$, $4B_1$ comes into point contact with the body to be driven 3. Therefore, frictional forces may concentrate on the above-mentioned portion of the protective film 5, thereby drastically advancing abrasion.

After forming the glass-containing portions $4A_1$, $4B_1$, the top portions of the glass-containing portions $4A_1$, $4B_1$ are polished flat. Since the top portions of the glass-containing portions $4A_1$, $4B_1$ are flat and thus have an even height, the protective film 5 and the body to be driven 3 come into surface contact with each other. This can disperse regions where frictional forces occur in the protective film 5, thereby inhibiting abrasion from advancing.

When polished flat, the top portions of the glass-containing portions $4A_1$, $4B_1$ have angular corners. When the top portions of the glass-containing portions $4A_1$, $4B_1$ have angular corners, chipping may occur in the glass-containing portions $4A_1$, $4B_1$ upon a slight shock. Therefore, it will be preferred if the corners of the top portions of the glass-containing portions $4A_1$, $4B_1$ are rounded by polishing (e.g., mechanical polishing or buffing).

Though the electrode layer (outer electrode layer 11) located on the outer surface of the piezoelectric element 2 and the electrode layers (relay electrode layer 21, first inner electrode layer 31, first ground electrode layer 41, and second inner electrode layer 51) located within the piezoelectric element 2 are electrically connected to each other by the through-hole conductors 6, 7, 8 positioned within the piezoelectric element 2, this is not restrictive. For example, an electrode included in an electrode layer located within the piezoelectric element 2 may be drawn so as to be exposed at the outer surface of the piezoelectric element 2, and the electrode portion thus drawn to be exposed at the outer surface of the piezoelectric element 2 and the electrode layer located on the outer surface of the piezoelectric element 2 may be electrically connected to each other through a conductor disposed on the outer surface of the piezoelectric element 2. Meanwhile, the protective film 5 is formed on the outer surface of the piezoelectric element 2 in this embodiment. When the protective film 5 contains an electrically conductive material, it will be preferred if a structure achieving electric connections by the through-hole conductors 6, 7, 8 is employed in order to prevent short circuits from occurring as well.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A piezoelectric actuator comprising:
    a piezoelectric element adapted to simultaneously generate first and second vibration modes in response to a voltage applied thereto, the piezoelectric element has an element body having a plurality of laminated piezoelectric layers and having a pair of principal surfaces opposing each other in a laminating direction of the piezoelectric layers, and a plurality of electrode layers arranged in the element body and opposing each other in the laminating direction; and
    a frictional portion arranged on one of the principal surfaces of the element body and adapted to come into contact with a body to be driven and cause a frictional force therewith;
    wherein the frictional portion has a glass-containing portion containing a glass material and being formed such as to project from the one of the principal surfaces of the element body, and
    wherein the glass material contained in the glass-containing portion is dispersed in the element body.

2. A piezoelectric actuator according to claim 1, wherein the frictional portion further has a protective film made of a material harder than the glass-containing portion, the protective film covering an outer surface of the glass-containing portion.

3. A piezoelectric actuator according to claim 2, wherein the protective film contains DLC, TiN, SiC, or BP.

4. A piezoelectric actuator according to claim 1, wherein the glass material contained in the glass-containing portion is dispersed in the piezoelectric element.

* * * * *